United States Patent
Yu et al.

(10) Patent No.: US 7,892,961 B2
(45) Date of Patent: Feb. 22, 2011

(54) METHODS FOR FORMING MOS DEVICES WITH METAL-INSERTED POLYSILICON GATE STACK

(75) Inventors: Chen-Hua Yu, Hsinchu (TW); Cheng-Tung Lin, Jhurdong (TW); Liang-Gi Yao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 869 days.

(21) Appl. No.: 11/809,337

(22) Filed: May 31, 2007

(65) Prior Publication Data

US 2008/0299754 A1    Dec. 4, 2008

(51) Int. Cl.
H01L 21/28     (2006.01)
H01L 21/3205   (2006.01)
H01L 21/321    (2006.01)
H01L 21/3213   (2006.01)
H01L 21/3215   (2006.01)
H01L 21/336    (2006.01)

(52) U.S. Cl. .............. 438/592; 438/199; 257/369; 257/E21.177; 257/E21.195; 257/E21.197; 257/E21.202; 257/E21.203; 257/E21.204

(58) Field of Classification Search .............. 438/199, 438/216, 287, 591, 592; 257/411, 369, E21.158, 257/E21.177, E21.19, E21.191, E21.195, 257/E21.197, E21.202, E21.203, E21.204
See application file for complete search history.

(56) References Cited

U.S. PATENT DOCUMENTS

| | | | |
|---|---|---|---|
| 6,492,217 B1 * | 12/2002 | Bai et al. | 438/199 |
| 6,670,226 B2 * | 12/2003 | Lin et al. | 438/199 |
| 6,828,187 B1 | 12/2004 | Liu et al. | |
| 7,126,157 B2 * | 10/2006 | Okada et al. | 257/59 |
| 7,157,767 B2 * | 1/2007 | Specht et al. | 257/315 |
| 7,160,774 B2 * | 1/2007 | Rabkin et al. | 438/257 |
| 7,332,388 B2 * | 2/2008 | Trivedi et al. | 438/199 |
| 7,419,867 B2 * | 9/2008 | Wieczorek et al. | 438/232 |
| 7,576,395 B2 * | 8/2009 | Jung et al. | 257/351 |
| 2003/0096471 A1 | 5/2003 | Lee et al. | |
| 2007/0057333 A1 * | 3/2007 | Park et al. | 257/411 |
| 2009/0186455 A1 * | 7/2009 | Bedell et al. | 438/199 |
| 2009/0275179 A1 * | 11/2009 | Basker et al. | 438/231 |
| 2009/0283817 A1 * | 11/2009 | Krishnamohan et al. | 257/321 |
| 2010/0025782 A1 * | 2/2010 | Griebenow et al. | 257/413 |

* cited by examiner

Primary Examiner—Mary Wilczewski
(74) Attorney, Agent, or Firm—Slater & Matsil, L.L.P.

(57) ABSTRACT

A method for forming a semiconductor structure includes providing a semiconductor substrate; forming a gate dielectric layer on the semiconductor substrate; forming a metal-containing layer on the gate dielectric; and forming a composite layer over the metal-containing layer. The step of forming the composite layer includes forming an un-doped silicon layer substantially free from p-type and n-type impurities; and forming a silicon layer adjoining the un-doped silicon layer. The step of forming the silicon layer comprises in-situ doping a first impurity. (or need to be change to: forming a silicon layer first & then forming un-doped silicon layer) The method further includes performing an annealing to diffuse the first impurity in the silicon layer into the un-doped silicon layer.

17 Claims, 6 Drawing Sheets

METHODS FOR FORMING MOS DEVICES WITH METAL-INSERTED POLYSILICON GATE STACK

TECHNICAL FIELD

This invention relates generally to semiconductor devices, and more particularly to structures and formation methods of metal-oxide-semiconductor devices having metal-inserted polysilicon gates.

BACKGROUND

Metal-oxide-semiconductor (MOS) devices are basic building elements in integrated circuits. In conventional MOS devices, gate electrodes often include polysilicon doped with p-type or n-type impurities, using doping operations such as ion implantation.

MOS devices with polysilicon gate electrodes exhibit a carrier depletion effect, also referred to as a poly depletion effect (also known as polysilicon depletion). The poly depletion effect occurs when an applied electric field sweeps away carriers from a region of a gate electrode close to a gate dielectric, forming a depletion layer. In n-doped polysilicon, the depletion layer includes ionized non-mobile donor sites. Whereas, in p-doped polysilicon, the depletion layer includes ionized non-mobile acceptor sites. The depletion effect increases the effective gate dielectric thickness, making it more difficult for an inversion layer to be created at the surface of the semiconductor.

Figure 1:
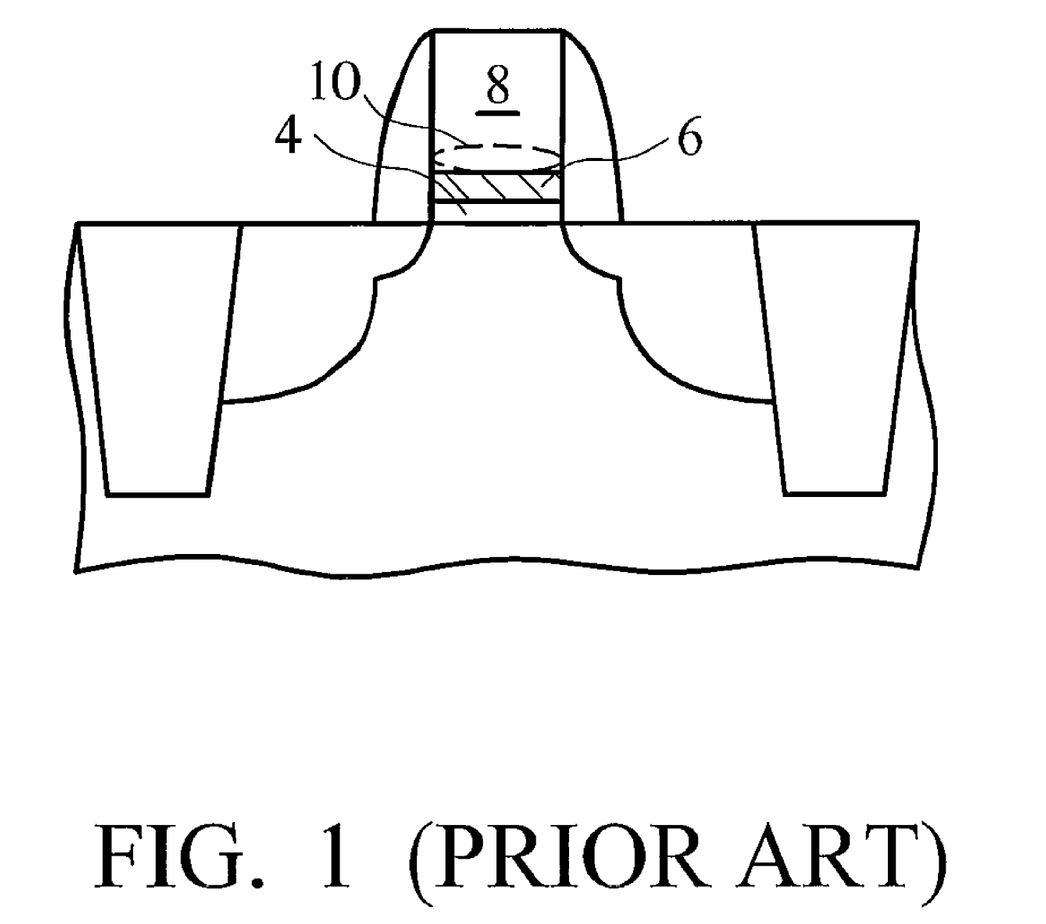
FIG. 1 illustrates a conventional MOS device having a metal-inserted polysilicon gate stack, wherein an impurity is introduced into polysilicon by an implantation.

To reduce the poly depletion effect, a metal layer may be inserted between a polysilicon gate electrode and the underlying gate dielectric. FIG. 1 illustrates a conventional MOS device having an inserted metal layer. The MOS device includes a gate stack including gate dielectric 4, inserted metal layer 6 over gate dielectric 4, and polysilicon gate electrode 8 over the inserted metal layer 6. In a typical process for forming the gate stack, a gate dielectric layer, a metal layer, and a gate electrode layer are blanket formed and patterned. The polysilicon gate electrode layer is implanted (pre-doped) with an impurity of a desired conductivity type. Then the stacked layers are patterned to form the gate stack. To avoid the implant-induced damage to gate dielectric 4, the energy and dosage of the implanted impurity are limited. As a result, lower portion 10 of polysilicon gate electrode 8 has a low impurity concentration. This has two adverse effects. First, the resistivity in lower portion 10 is high. When a voltage is applied on polysilicon gate electrode 8, a voltage drop may occur in lower portion 10 (partially due to a possible gate leakage current), and the effective gate voltage Vg applied on gate dielectric 4 is reduced. Consequently, the device drive current is reduced. Second, for optimum performance, the work function of polysilicon gate electrode 8 needs to be adjusted to the corresponding band-edge work function, which depends on the conductivity type of the corresponding MOS device. The work function of polysilicon gate electrode 8 may be adjusted through implanting appropriate impurities. However, since the energy and dosage of the pre-doping are limited, it is hard to adjust the work function to corresponding band-edges. A solution is thus needed to solve the above-discussed problems.

SUMMARY OF THE INVENTION

In accordance with one aspect of the present invention, a method for forming a semiconductor structure includes providing a semiconductor substrate; forming a gate dielectric layer on the semiconductor substrate; forming a metal-containing layer on the gate dielectric; and forming a composite layer over the metal-containing layer. The step of forming the composite layer includes forming an un-doped silicon layer substantially free from p-type and n-type impurities; and forming a silicon layer adjoining the un-doped silicon layer. The step of forming the silicon layer comprises in-situ doping a first impurity. The method further includes performing an annealing to diffuse the first impurity in the silicon layer into the un-doped silicon layer.

In accordance with another aspect of the present invention, a method for forming a semiconductor structure includes providing a semiconductor substrate comprising a first region and a second region; forming a gate dielectric layer on the semiconductor substrate, wherein the gate dielectric layer extends from the first region to the second region; forming a metal-containing layer over the gate dielectric layer; forming a first silicon-containing layer on the metal-containing layer in the first region, wherein the first silicon-containing layer is in-situ doped with a first impurity of a first conductivity type; forming a second silicon-containing layer on the metal-containing layer in the second region, wherein the second silicon-containing layer is in-situ doped with a second impurity of a second conductivity type opposite the first conductivity type; forming an un-doped silicon-containing layer having a first portion adjoining the first silicon-containing layer and a second portion adjoining the second silicon-containing layer; and performing a diffusion annealing to diffuse the first and the second impurities in the first and the second silicon-containing layers into the first and the second portions of the un-doped silicon-containing layer, respectively.

In accordance with yet another aspect of the present invention, a method for forming a semiconductor structure includes providing a semiconductor substrate comprising a first region and a second region; forming a gate dielectric layer on the semiconductor substrate; forming a metal-containing layer over the gate dielectric layer; forming a first silicon layer over the metal-containing layer, wherein the first silicon layer is in-situ doped with a first impurity of a first conductivity type; removing the first silicon layer from the second region; blanket forming an un-doped silicon layer in the first and the second regions, wherein the un-doped silicon layer has a portion over the first silicon layer; blanket forming a second silicon layer on the un-doped silicon layer; removing the second silicon layer from the first region; performing an annealing to diffuse the first and the second impurities from the first and the second silicon layers into respective adjoining portions of the un-doped silicon layer; patterning the gate dielectric layer, the metal-containing layer and the first silicon layer in the first region to form a first gate stack in the first region; and patterning the gate dielectric layer, the metal-containing layer and the second silicon layer in the second region to form a second gate stack in the second region.

The advantageous features of the present invention include increased effective gate voltages, improved drive currents, and an improved ability for adjusting work functions of the gates of the resulting MOS devices.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A through 10 are cross-sectional views of intermediate stages in the manufacturing of embodiments of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming a metal-inserted polysilicon gate stack of a metal-oxide-semiconductor (MOS) device is provided. The intermediate stages of manufacturing embodiments of the present invention are illustrated. Throughout various views and illustrative embodiments of the present invention, like reference numbers are used to designate like elements.

Figure 2A:
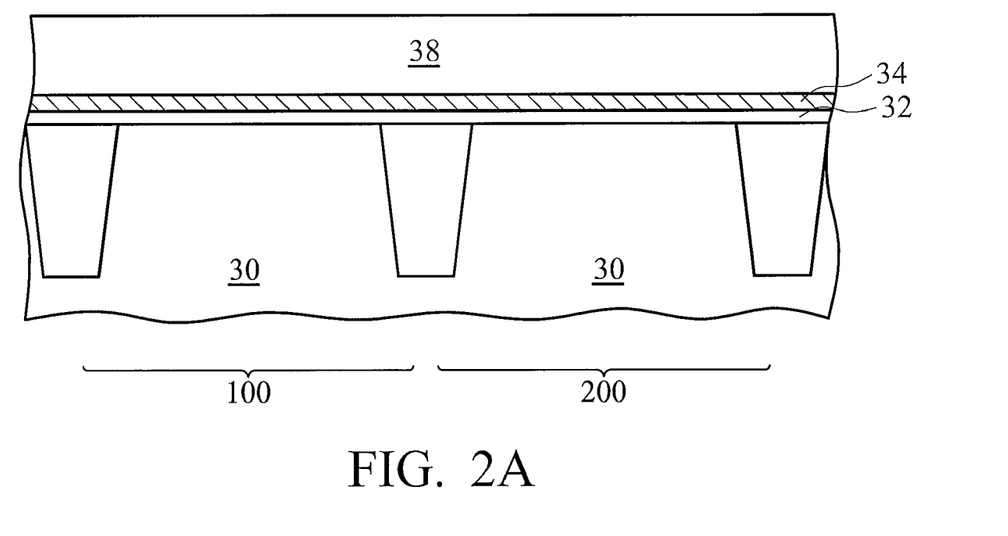

FIG. 2A illustrates the formation of gate dielectric layer 32, metal-containing layer 34 and silicon-containing layer 38 on substrate 30. Substrate 30 includes active region 100 for forming an NMOS device and active region 200 for forming a PMOS device. Substrate 30 preferably includes bulk silicon, although other commonly used structures and semiconductor materials such as silicon-on-insulator (SOI) and silicon alloys can be used. Preferably, substrate 30 is lightly doped, and well regions (not shown) with appropriate conductivity types may be formed. Shallow trench isolation (STI) regions may be formed to isolate the MOS devices.

In an embodiment, gate dielectric layer 32 includes silicon oxide, which may be formed by a thermal oxidation of substrate 30. In other embodiments, gate dielectric layer 32 includes dielectric materials having a high dielectric constant (k value), for example, greater than about 3.9. The preferred materials include silicon nitrides, oxynitrides, metal oxides such as $HfO_2$, $HfZrO_x$, $HfSiO_x$, $HfTiO_x$, $HfAlO_x$, and the like, and combinations and multi-layers thereof. The preferred thickness ranges between about 5 Å and about 100 Å. In an exemplary embodiment, the thickness of gate dielectric layer 32 is about 25 Å.

Metal-containing layer 34 is formed over gate dielectric layer 32. In the preferred embodiment, metal-containing layer 34 includes metal nitrides (such as titanium nitride (TiN), tantalum nitride (TaN) and molybdenum nitride ($MoN_x$)), metal carbides (such as TaC and HfC), metal-nitride-carbides (such as TaCN), metal oxides (such as molybdenum oxide ($MoO_x$)), metal oxynitrides (such as molybdenum oxynitride ($MoO_xN_y$)), and combinations thereof. In other embodiments, metal-containing layer 34 includes metals such as titanium, tantalum, molybdenum, tungsten, and combinations thereof. In yet other embodiments, metal-containing layer 34 includes metal silicides such as nickel silicide, cobalt silicide, titanium silicide, hafnium silicide, tungsten silicide, molybdenum silicide, and combinations thereof. Metal-containing layer 34 is preferably thin, so that it has little effect on the work function the resulting MOS devices gates. Preferably, the thickness of metal-containing layer 34 is less than about 50 Å. In an exemplary embodiment, the thickness of metal-containing layer 34 is about 10 Å. Metal-containing layer 34 may be formed using commonly used methods, such as low pressure chemical vapor deposition (LPCVD), plasma enhanced CVD (PECVD), atomic layer deposition (ALD), atomic vapor deposition (AVD), metal organic CVD (MOCVD), physical sputtering, evaporation, e-gun evaporation, and the like.

Silicon layer 38 is then formed over metal-containing layer 34. In an exemplary embodiment, silicon layer 38 includes polysilicon or amorphous silicon. In other embodiments, silicon layer 38 may include other elements such as germanium, carbon, nitrogen, and the like. Preferably, silicon layer 38 is in-situ doped with an n-type impurity, such as phosphorous and/or arsenic, with a preferred impurity concentration of between about $5E20/cm^3$ and about $3E21/cm^3$. The formation methods include commonly used CVD methods such as LPCVD, PECVD, and the like. The precursors preferably include a silicon-containing gas such as silane. In an exemplary embodiment, the doping of impurities is achieved by simultaneously introducing silicon-containing precursors and impurity-containing process gases, such as $PH_3$. The thickness of silicon-containing layer 38 preferably ranges between about 500 Å and about 2500 Å. In an exemplary embodiment, the thickness of silicon-containing layer 38 is about 1000 Å.

Figure 2B:
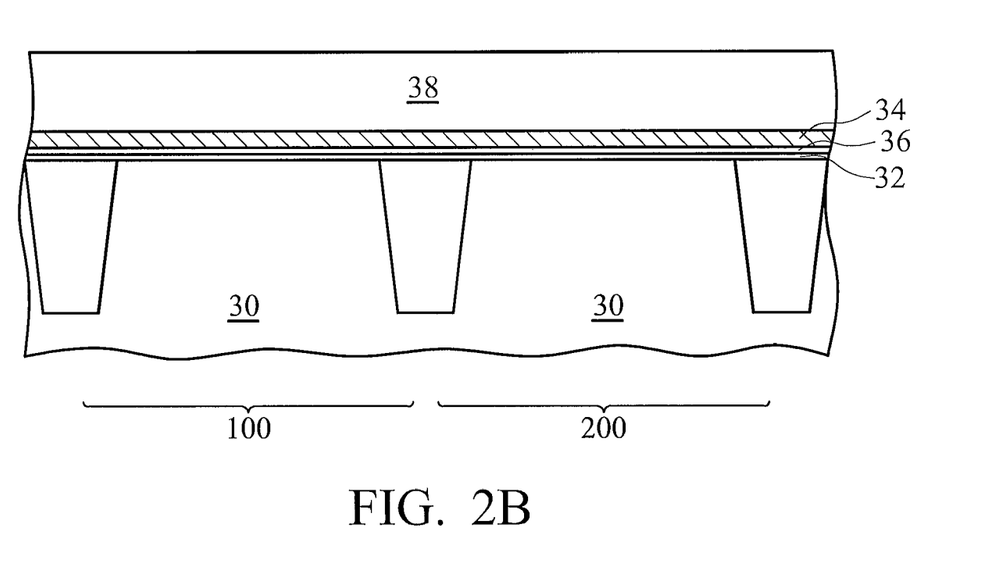

FIG. 2B illustrates the optional formation of capping layer 36 between gate dielectric layer 32 and metal-containing layer 34. The thickness of capping layer 36 is preferably less than about 30 Å, and more preferably between about 3 Å and about 10 Å. Capping layer 36 may be formed of oxides and/or nitrides such as aluminum oxide, aluminum nitride, and the like. For simplicity, capping layer 36 is not shown in subsequent drawings. Capping layer functions in adjusting the resulting gate's work function.

Figure 3:
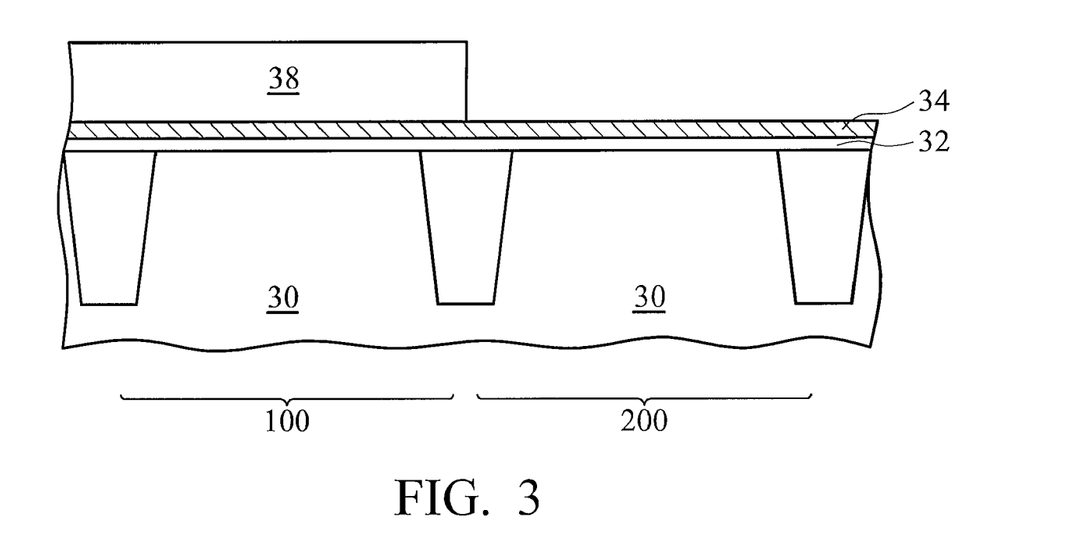

FIG. 3 illustrates the removal of silicon-containing layer 38 from PMOS region 200. In an exemplary embodiment, a photoresist (not shown) is formed to mask NMOS region 100. A dry etch is then performed by using, for example, HBr as an etchant. Time mode is preferably used to control the etching of silicon-containing layer 38 to avoid etching underlying metal-containing layer 34.

Figure 4:
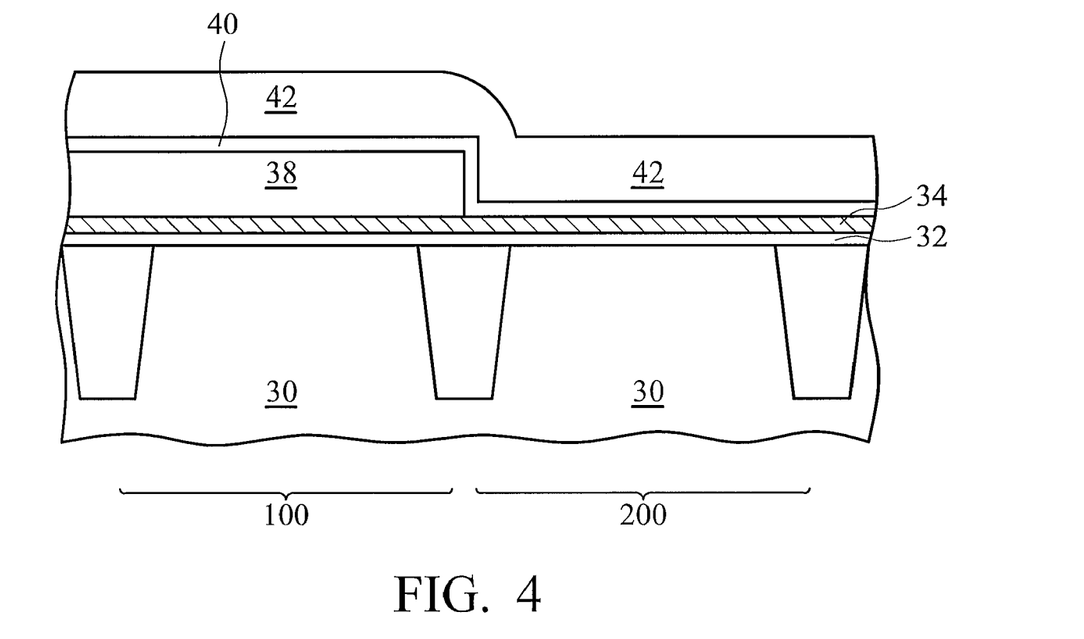

Referring to FIG. 4, un-doped silicon layer 40 and doped silicon layer 42 are blanket formed. Un-doped silicon layer 40 is may be doped to a very low impurity concentration compared to the impurity concentration in silicon layer 38, although it is preferable that it is not doped at all. The thickness of un-doped silicon layer 40 is preferably between about 10 Å and about 300 Å. In an exemplary embodiment, the thickness of un-doped silicon layer 40 is about 50 Å.

Silicon layer 42 preferably includes polysilicon or amorphous silicon, although other elements such as germanium and/or carbon may be added. The formation of silicon layer 42 is similar to the formation of silicon layer 38, except that p-type impurities, such as boron and/or indium, are in-situ doped. The p-type impurities are preferably doped to a concentration of between about $2E20/cm^3$ and about $4E21/cm^3$. In an exemplary embodiment, the doping of the p-type impurities is achieved by simultaneously introducing silicon-containing precursors and impurity-containing process gases, such as $B_2H_6$, into the deposition environment. The thickness of silicon layer 42 is preferably similar to that of silicon layer 38.

Figure 5:
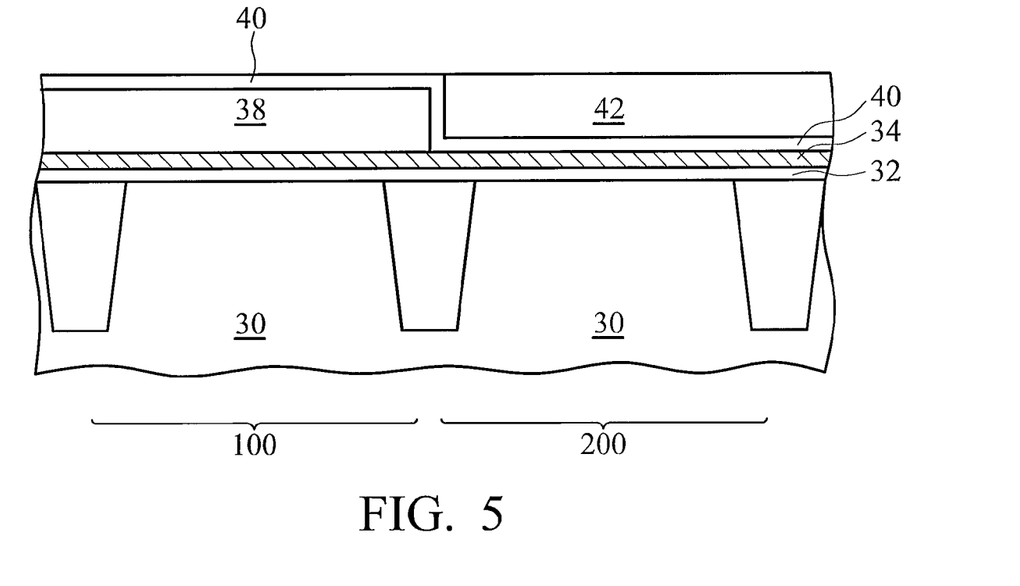

FIG. 5 illustrates the removal of silicon layer 42 from NMOS region 100, which may be achieved by forming a photoresist (not shown) covering PMOS region 200, and etching portions of silicon layer 42 in NMOS region 100. Due to different etching rates between un-doped silicon layer 40 and doped silicon layer 42, the un-doped silicon layer 40 may be used as an etch stop layer, and the etching selectivity between un-doped silicon layer 40 and doped silicon layer 42 may be tuned by adjusting the etching recipe. Alternatively, a chemical mechanical polish (CMP) is performed to remove undesired portions of silicon layer 42. In the resulting structure, a thin un-doped silicon layer 40 may be left over silicon layer 38. Otherwise, the un-doped silicon layer 40 may be substantially removed.

In the embodiment discussed in the preceding paragraphs, an n-type doped silicon layer 38 is formed prior to the formation of p-type doped silicon layer 42. In alternative embodiments, a p-type doped silicon layer may be formed first. After a portion of the p-type doped silicon layer is removed from NMOS region 100, an n-type doped silicon layer is formed therein.

Figure 6:
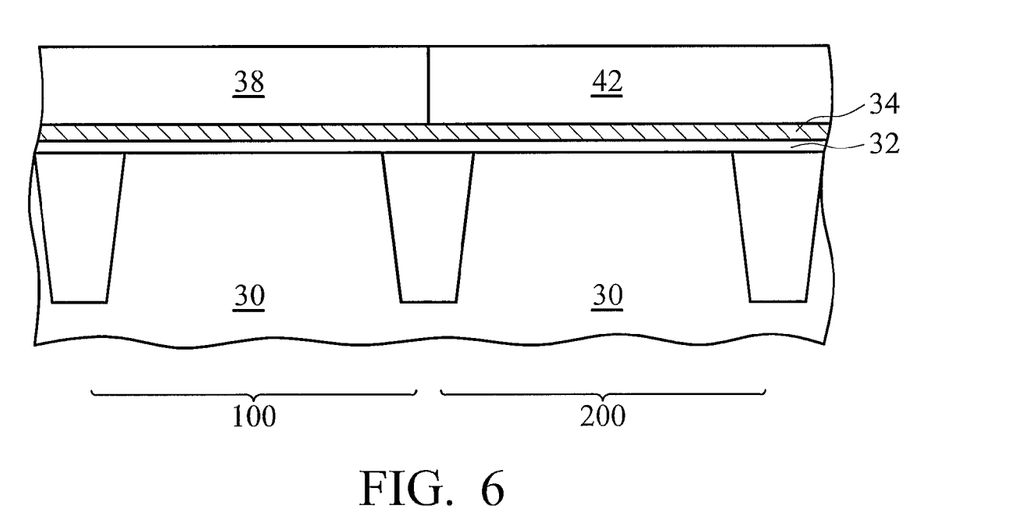

A pre-gate annealing (also referred throughout the description to as diffusion annealing) is then performed, and the impurities are diffused from doped silicon layers 38 and 42 to the overlying and underlying un-doped silicon layer 40, respectively. As a result, un-doped silicon layer 40 is merged into the underlying silicon layer 38 or overlying silicon layer 42, as is shown in FIG. 6. The resulting silicon layers 38 and 42 are substantially uniformly doped. It is to be realized that due to the diffusion of the impurities, portions of silicon layers 38 and 42 close to the un-doped silicon layer 40, may have a reduced impurity concentration. However, since the un-doped silicon region 40 is thin, the reduction in the impurity concentration in silicon layers 38 and 42 is minimal. Preferably, the pre-gate annealing includes rapid thermal anneal (RTA), which may be performed at 850° C. for a duration of about 20 seconds. Other commonly used annealing methods may also be used. During the pre-gate annealing, metal-containing layer 34 acts as a diffusion barrier, preventing impurities in silicon layers 38 and 42 from being diffused into gate dielectric layer 32.

Figure 7:
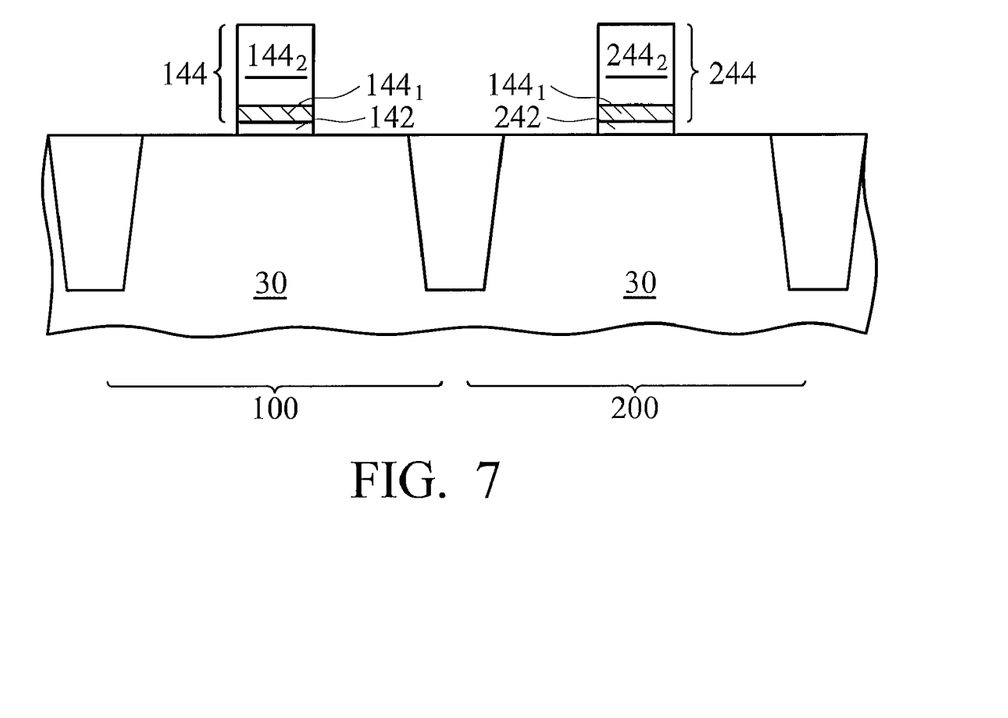

FIG. 7 illustrates the formation of gate stacks, wherein gate dielectric layer 32, metal-containing layer 34 and doped silicon layers 38 and 40 are patterned to form gate stacks in regions 100 and 200. As a result, gate dielectric 142 and gate electrode 144 are formed in NMOS region 100, and gate dielectric 242 and gate electrode 244 are formed in PMOS region 200. Please note that gate electrode 144 includes metal-containing portion 144$_1$ and doped silicon portion 144$_2$, and gate electrode 244 includes metal-containing portion 244$_1$ and doped silicon portion 244$_2$.

Figure 8:
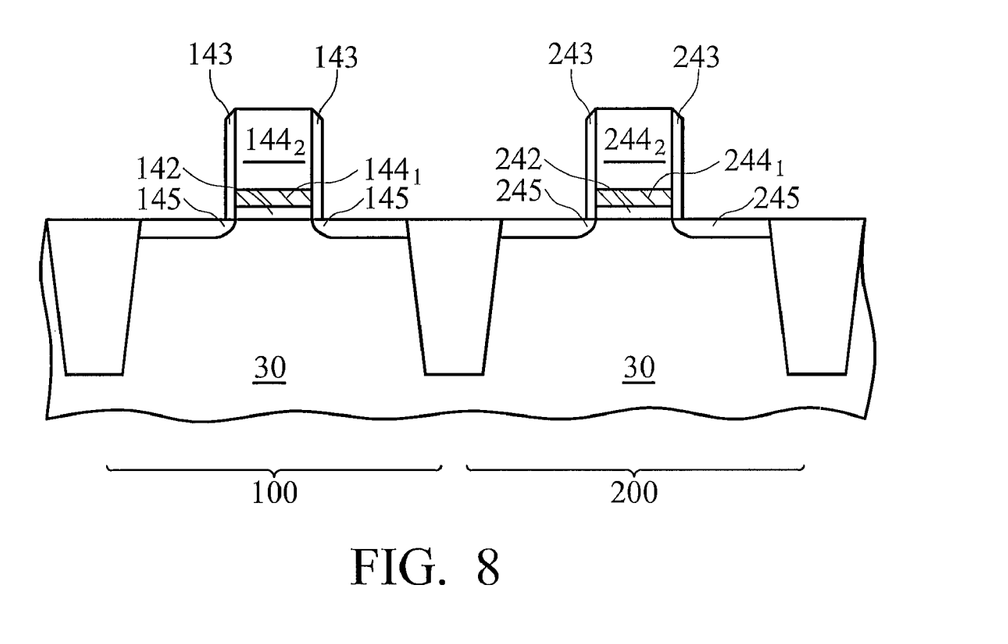

Referring to FIG. 8, optional nitride spacers 143 and 243, also referred to as nitride sealer layers, are formed to seal gate stacks 144 and 244 and to prevent the exposure of metal-containing layers 144$_1$ and 244$_1$ in subsequent processes. Nitride spacers 143 and 243 prevent the cross-contamination between metal-containing layers 144$_1$ and 244$_1$ and other exposed components. Preferably, nitride spacers 143 and 243 are formed by blanket depositing a thin silicon nitride layer over the structure shown in FIG. 7, and etching horizontal portions of the blanket silicon nitride layer, leaving nitride spacers 143 and 243. Lightly doped source/drain (LDD) regions 145 and 245 and gate spacers 146 and 246 are then formed. As is known in the art, LDD regions 145 and 245 may be formed by implanting n-type and p-type impurities into NMOS region 100 and PMOS region 200, respectively. Due to the masking of gate electrodes 144 and 244 and optional nitride spacers 143 and 243, LDD regions 145 and 245 are substantially aligned to the edges of gate electrodes 144 and 244, or nitride spacers 143 and 243 if they exist, respectively.

Figure 9:
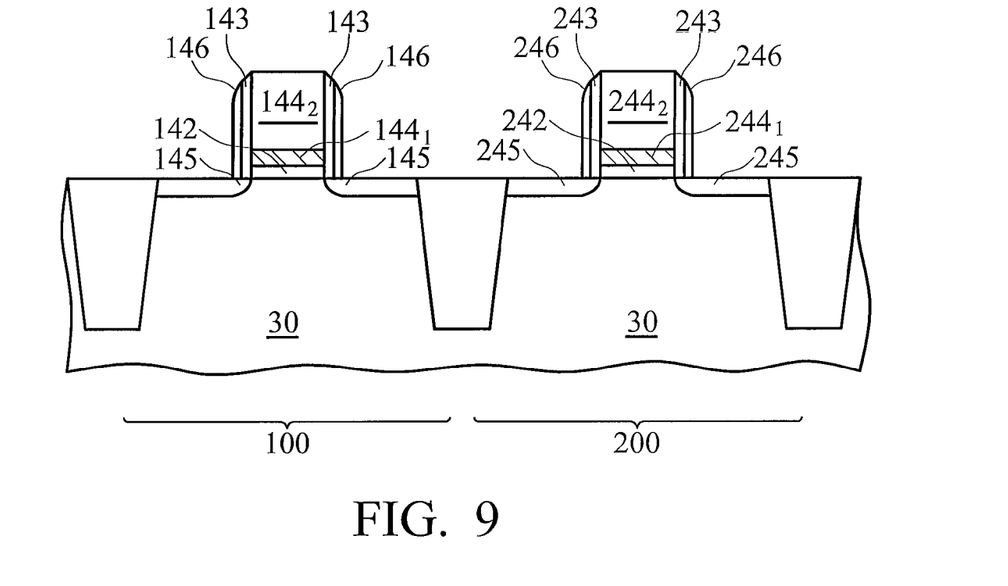

Next, as shown in FIG. 9, gate spacers 146 and 246 are formed. Preferably, gate spacers 146 and 246 are formed by depositing one or more spacer layers (not shown), and removing horizontal portions of the spacer layers by etching. In the preferred embodiment, the spacer layers include a nitride layer on a liner oxide layer. The preferred spacer deposition methods include PECVD, LPCVD, sub-atmospheric CVD (SACVD), and the like.

Figure 10:
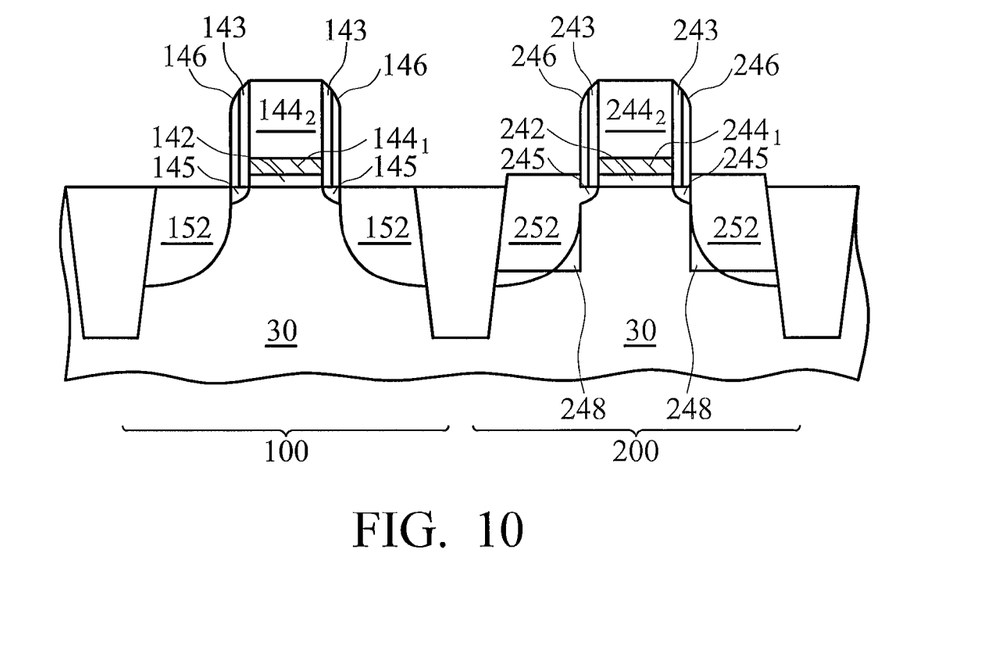

FIG. 10 illustrates the formation of deep source/drain regions 152 and 252 for NMOS and PMOS devices, respectively. In the preferred embodiment, SiGe stressors 248 are formed for the PMOS device. The formation processes for deep source/drain regions 152 and 252 and SiGe stressors 248 are well known in the art, and thus are not repeated herein.

An annealing process (referred to as activation annealing hereinafter) is preformed to activate impurities in LDD regions 145 and 245 and deep source/drain regions 152 and 252. At the same time, the in-situ doped impurities in gate electrodes 144 and 244 are also activated. Preferably, the activation includes annealing methods with very short durations, for example, flash anneal, laser anneal, and the like. The order of the diffusion annealing and the activation annealing can be reversed.

In the embodiment discussed in the preceding paragraphs, the diffusion annealing is performed before the patterning of gate dielectric layer 32, metal-containing layer 34 and doped silicon layers 38 and 42 (refer to FIG. 5). In other embodiments, the diffusion annealing is performed after the formation of the gate stacks. In an exemplary embodiment, the diffusion annealing is performed after the patterning, but before forming the LDD regions, or even after forming LDD regions, but before the activation annealing.

The embodiments of the present invention have several advantageous features. Since the impurities are in-situ doped into silicon layers 38 and 42 (refer to FIG. 5), no implant-induced damage occurs to the gate dielectrics underlying the polysilicon layers. Thus, the impurities may be pre-doped to a very high concentration. This eliminates the lightly doped region in gate electrodes. Accordingly, the effective gate voltage, and hence the device drive current, is improved. Furthermore, with high impurity concentrations in gate electrodes, band-edge work functions are easier to achieve.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a semiconductor substrate;
   forming a gate dielectric layer on the semiconductor substrate;
   forming a metal-containing layer on the gate dielectric;
   forming a composite layer over the metal-containing layer comprising:
     forming an un-doped silicon layer substantially free from p-type and n-type impurities; and forming a silicon layer adjoining the un-doped silicon layer, wherein the step of forming the silicon layer comprises in-situ doping a first impurity;

forming an additional silicon layer on the un-doped silicon layer, wherein the additional silicon layer is in-situ doped with a second impurity having an opposite conductivity type than the first impurity;

removing the additional silicon layer; and after the step of removing the additional silicon layer, performing an annealing to diffuse the first impurity in the silicon layer into the un-doped silicon layer.

2. The method of claim 1, wherein the un-doped silicon layer is underlying the silicon layer.

3. The method of claim 1, wherein the un-doped silicon layer is overlying the silicon layer.

4. The method of claim 1, wherein the method further comprises forming a capping layer between the gate dielectric layer and the metal-containing layer.

5. The method of claim 1 further comprising patterning the gate dielectric layer, the metal-containing layer and the composite layer to form a gate stack.

6. The method of claim 5, wherein the annealing is performed before the step of patterning.

7. The method of claim 1, wherein each of the un-doped silicon layer and the silicon layer comprises a material selected from the group consisting essentially of polysilicon and amorphous silicon.

8. The method of claim 1, wherein the un-doped silicon layer has a thickness of less than about 300Å.

9. The method of claim 1, wherein the silicon layer is in-situ doped to an impurity concentration of greater than about $2E20/cm^3$.

10. The method of claim 1, wherein the metal-containing layer comprises a material selected from the group consisting essentially of metal nitride, metal carbide, metal carbide-nitride, metal oxide, metal oxynitride, and combinations thereof.

11. A method for forming a semiconductor structure, the method comprising:

providing a semiconductor substrate comprising a first region and a second region;

forming a gate dielectric layer on the semiconductor substrate, wherein the gate dielectric layer extends from the first region to the second region;

forming a capping layer over the gate dielectric layer before the step of forming the metal-containing layer;

forming a metal-containing layer over the capping layer;

forming a first silicon-containing layer on the metal-containing layer in the first region, wherein the first silicon-containing layer is in-situ doped with a first impurity of a first conductivity type;

forming a second silicon-containing layer on the metal-containing layer in the second region, wherein the second silicon-containing layer is in-situ doped with a second impurity of a second conductivity type opposite the first conductivity type;

forming an un-doped silicon-containing layer having a first portion adjoining the first silicon-containing layer and a second portion adjoining the second silicon-containing layer;

performing a diffusion annealing to diffuse the first and the second impurities in the first and the second silicon-containing layers into the first and the second portions of the un-doped silicon-containing layer, respectively;

removing an extended portion of the first silicon-containing layer from the second region before the step of forming the second silicon-containing layer;

blanket forming the un-doped silicon-containing layer in the first and the second regions; wherein the un-doped silicon layer has a portion on the first silicon-containing layer;

blanket forming the second silicon-containing layer over the un-doped silicon layer; and removing the second silicon-containing layer from the first region.

12. The method of claim 11 wherein the step of removing the second silicon-containing layer from the first region comprises etching the second silicon-containing layer using the un-doped silicon-containing layer as an etch stop layer.

13. The method of claim 11, wherein the un-doped layer has a thickness substantially smaller than each of a thickness of the first silicon-containing layer and a thickness of the second silicon-containing layer.

14. A method for forming a semiconductor structure, the method comprising:

providing a semiconductor substrate comprising a first region and a second region;

forming a gate dielectric layer on the semiconductor substrate;

forming a metal-containing layer over the gate dielectric layer;

forming a first silicon layer over the metal-containing layer, wherein the first silicon layer is in-situ doped with a first impurity of a first conductivity type;

removing the first silicon layer from the second region;

blanket forming an un-doped silicon layer in the first and the second regions, wherein the un-doped silicon layer has a portion over the first silicon layer;

blanket forming a second silicon layer on the un-doped silicon layer;

removing the second silicon layer from the first region;

performing an annealing to diffuse the first and the second impurities from the first and the second silicon layers into respective adjoining portions of the un-doped silicon layer;

patterning the gate dielectric layer, the metal-containing layer and the first silicon layer in the first region to form a first gate stack in the first region; and patterning the gate dielectric layer, the metal-containing layer and the second silicon layer in the second region to form a second gate stack in the second region.

15. The method of claim 14, wherein the step of removing the second silicon layer comprises etching the second silicon layer, and wherein the un-doped silicon layer is used as an etch stop layer.

16. The method of claim 14, wherein the un-doped silicon layer has a thickness of less than about 300 Å.

17. The method of claim 14 further comprising forming a metal oxide capping layer on the metal-containing layer, wherein the metal-containing layer comprises a metal nitride.

* * * * *